(12) United States Patent
Elgaard et al.

(10) Patent No.: US 11,258,413 B2
(45) Date of Patent: Feb. 22, 2022

(54) POWER AMPLIFIER ARRANGEMENT

(71) Applicant: Telefonaktiebolaget LM Ericsson (publ), Stockholm (SE)

(72) Inventors: Christian Elgaard, Lund (SE); Stefan Andersson, Flyinge (SE); Lars Sundström, Södra Sandby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 40 days.

(21) Appl. No.: 16/959,730

(22) PCT Filed: Jan. 17, 2018

(86) PCT No.: PCT/EP2018/051091
§ 371 (c)(1),
(2) Date: Jul. 2, 2020

(87) PCT Pub. No.: WO2019/141355
PCT Pub. Date: Jul. 25, 2019

(65) Prior Publication Data
US 2020/0389136 A1 Dec. 10, 2020

(51) Int. Cl.
*H03F 3/45* (2006.01)
*H03F 3/24* (2006.01)
*H03F 3/195* (2006.01)

(52) U.S. Cl.
CPC ............ *H03F 3/245* (2013.01); *H03F 3/195* (2013.01); *H03F 2200/102* (2013.01); *H03F 2200/18* (2013.01); *H03F 2200/447* (2013.01); *H03F 2200/451* (2013.01)

(58) Field of Classification Search
CPC ..................................... H03F 3/45; H03F 1/30
USPC ......................................... 330/253, 289, 261
See application file for complete search history.

(56) References Cited

U.S. PATENT DOCUMENTS

| 4,975,604 A * | 12/1990 | Barta ................... H03H 11/245 327/308 |
| 7,132,888 B2 * | 11/2006 | Behzad ............... H01L 27/0248 330/254 |
| 2014/0266448 A1 | 9/2014 | Cha et al. |
| 2015/0270812 A1 | 9/2015 | Papamichail |

OTHER PUBLICATIONS

Strandvik, E., "Compensation of Threshold Voltage for Process and Temperature Variations in 28nm UTBB FDSOI", NTNU—Trondheim Norwegian University of Science and Technology, Jun. 1, 2015, pp. 1-86, NTNU.

(Continued)

*Primary Examiner* — Henry Choe
(74) *Attorney, Agent, or Firm* — Coats & Bennett, PLLC

(57) ABSTRACT

A power amplifier arrangement comprises a power amplifier comprising at least one transistor having a first gate and a second gate. The first gate is configured to receive a radio frequency input signal superimposed with a first control signal, and the second gate is configured to receive a second control signal. The first control signal is a linearization signal varying in relation to an envelope of the input signal and the second control signal is a temperature compensation signal varying in relation to a temperature of the power amplifier, or vice versa.

12 Claims, 6 Drawing Sheets

(56) References Cited

OTHER PUBLICATIONS

Pereira, N. et al., "Cascode Amplifiers with Low-Gain Variability Using Body-Biasing Temperature and Supply Compensation", MIXDES 2013, 20th International Conference Mixed Design of Integrated Circuits and Systems, Jun. 20, 2013, pp. 209-212, Lodz University of Technology Department of Microelectronics & Computer Science.

Ghajar, M. et al., "Backgate Modulation Technique for Higher Efficiency Envelope Tracking", IEEE Transactions on Microwave Theory and Techniques, vol. 61 No. 4, Apr. 1, 2013, pp. 1599-1607, IEEE.

Blalock, B. et al., "A Low-Voltage, Bulk-Driven MOSFET Current Mirror for CMOS Technology", Proceedings of ISCAS'95—International Symposium on Circuits and Systems, Apr. 30, 1995, pp. 1972-1975, IEEE.

Pereira, N. et al., "Design of Cascode-Based Transconductance Amplifiers with Low-Gain PVT Variability and Gain Enhancement Using a Body-Biasing Technique", Doctoral Conference on Computing, Electrical and Industrial Systems (DoCEIS) 2013: Technological Innovation for the Internet of Things, vol. 294, pp. 590-599, Apr. 1, 2013, Springer.

Cassia, M., "Low Power / Low Voltage Techniques for Analog CMOS Circuits", Technical University of Denmark (DTU) Thesis, Jul. 31, 2004, pp. 1-17, 41-43, 103-104, DTU.

\* cited by examiner

POWER AMPLIFIER ARRANGEMENT

TECHNICAL FIELD

Embodiments herein relate to power amplifier arrangement. In particular, they relate to power amplifier arrangement with analog pre-distortion and temperature compensation bias, and an electronic circuit and apparatus comprising the power amplifier arrangement.

BACKGROUND

Power amplifiers (PA) are ubiquitous in wireless communication equipment or device. In cellular system equipment there are stringent requirements on spectral emission levels, error-vector magnitude (EVM), and output power. Thus it is important that the behavior of the PA is well controlled over time. Furthermore, in the case linearization is applied to the PA, e.g. to allow more power efficient operation while maintaining certain emission levels etc., it is important that the characteristics of the PA nonlinearity is always within the capability of the linearizer to correct for said nonlinearity. Unfortunately, the PA must be able to operate over a large temperature range for which the PA characteristics may change substantially. The PA will experience a changing temperature both due to changing ambient temperature, i.e. slow variation, and due to self-heating when its own power consumption changes, i.e. fast variation due to change in output power or turning on of PA. Existing techniques offer bias circuits that change the PAs bias condition with respect to temperature.

As mentioned above, there are spectral emission and EVM requirements and those are fulfilled by ensuring a sufficiently linear PA characteristic. To enable operation at high power, efficiency linearization must be adopted. The linearity may be improved by various techniques. One of which is to use an analog linearization method to increase the bias of a PA, for tracking the envelope of the input signal. This means that the direct current (DC) bias signal bandwidth may change in proportion to the modulation bandwidth.

If an analog linearization method is used to vary the bias voltage of the PAs input transistor gates, with the rate of the envelope of the modulation signal, and at the same time a temperature regulating bias circuit is used to change the bias voltage of the input transistor relatively slowly, then these two voltages should be added before being applied to the PA. Adding voltages with high bandwidth and large dynamic range is challenging and the performance of at least one of the bias controls may be compromised.

SUMMARY

Therefor it is an object of embodiments herein to provide an effective method enables applying both analog pre-distortion and temperature compensation bias at the same time for a power amplifier.

According to one aspect of embodiments herein, the object is achieved by a power amplifier arrangement. The power amplifier arrangement comprises a power amplifier comprising at least one transistor having a first gate and a second gate. The first gate is configured to receive a radio frequency input signal superimposed with a first control signal, and the second gate is configured to receive a second control signal. The first control signal is a linearization signal varying in relation to an envelope of the input signal and the second control signal is a temperature compensation signal varying in relation to a temperature of the power amplifier, or vice versa.

In other words, according to some embodiments herein, based on a PA implemented in Silicon on Insulator (SOI) process, where in addition to a gate, a drain and a source, a bulk of the PA transistor device is a fourth accessible terminal termed a back gate, i.e. the second gate. The back gate is used to control the PA device with respect to temperature variation. As it effectively may be used to modulate a voltage threshold, Vth, of the device, while the gate is used for linearization.

The first control signal, e.g. a faster changing analog linearization signal, in addition to the fundamental frequency input signal, may be connected to the first gate and the second control signal, e.g. a slower changing temperature compensation signal may be connected to the back gate. In this way, the PA will benefit both from the analog linearization changing bias and the temperature compensation bias at the same time.

The embodiments herein enable an effective method of both applying analog pre-distortion and temperature compensation bias at the same time for a power amplifier without compromising respective function. To guarantee that the temperature dependence of the back gate bias signal tracks the inherently same process variation as the process variation of the target transistors inside the PA, the bias signal may be generated from a constant transconductance bias circuit operating on the back gate according to embodiments herein.

Furthermore, it is anticipated that process technology evolution may lead to better back gate properties in which case the bias techniques according to embodiments herein become increasingly important.

Therefore, the embodiments herein provide an effective method enables applying both analog pre-distortion and temperature compensation bias at the same time for a power amplifier.

BRIEF DESCRIPTION OF THE DRAWINGS

Examples of embodiments herein are described in more detail with reference to attached drawings in which.

DETAILED DESCRIPTION

As a part of developing embodiments herein, transistors' characteristic in, for instance SOI processes, will first be discussed. The transistor in SOI process has four terminals or nodes: gate, source, drain, and back gate which may also be refereed as body or bulk. The back gate terminal may be used to modify a voltage threshold (Vth) of the transistor device. The transconductance of the transistor may, as a first-order approximation, be written as:

$$gm = \frac{2I_d}{V_{eff}}, V_{eff} = V_{gs} - V_{th}$$

Where $V_{gs}$ is gate to source voltage, $I_d$ is DC current through the transistor. As seen from the equation, it is possible to modify the transconductance gm of a transistor for a given quiescent current $I_d$ by modifying the threshold voltage.

Figure 1:
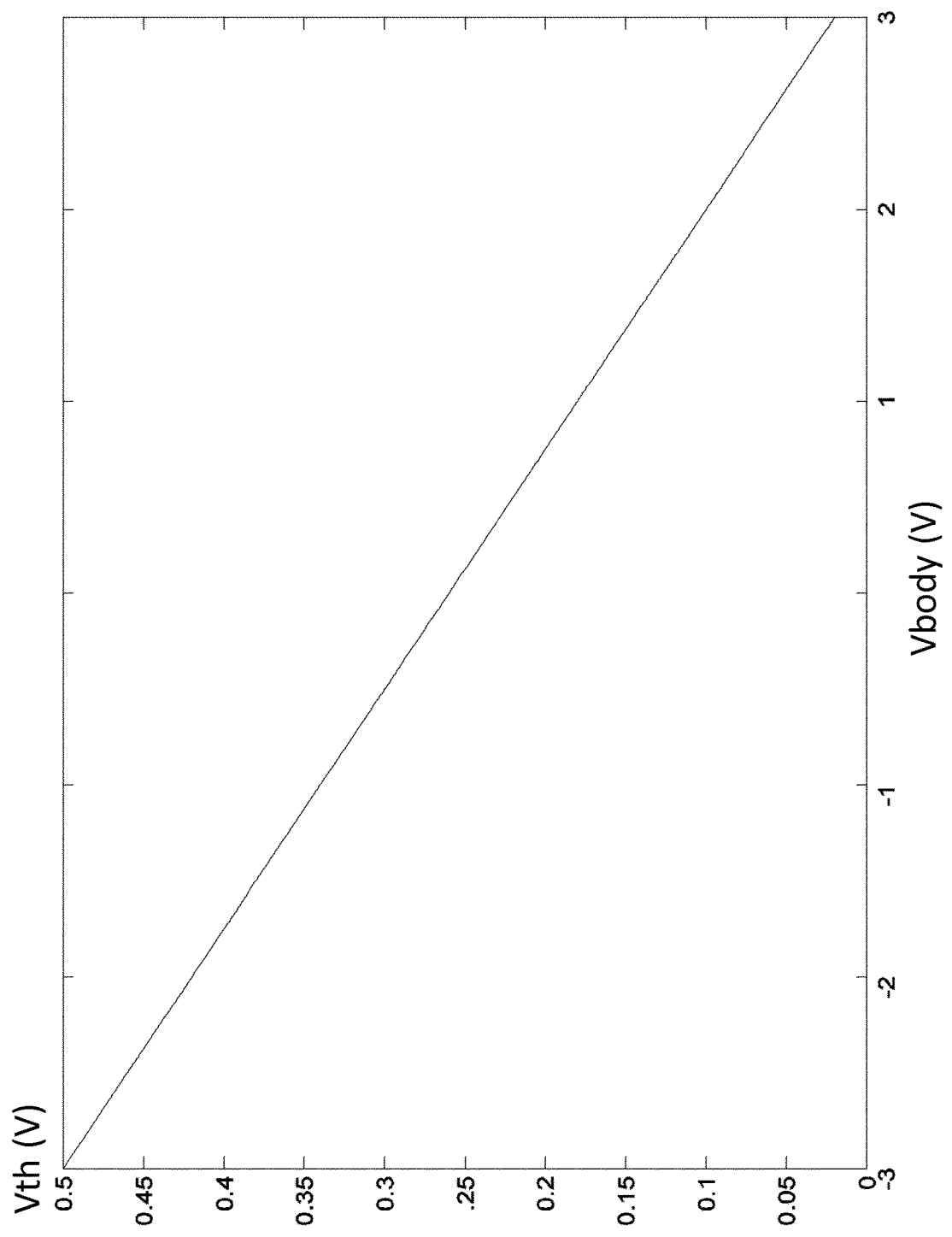
FIG. 1 is a diagram illustrating an SOI process threshold voltage versus back gate bias voltage.

FIG. 1 shows threshold voltage Vth versus back gate bias voltage Vbody for a transistor in an SOI process. As shown in FIG. 1, the threshold voltage is modified from about 500 mV down to 20 mV by increasing bulk node voltage potential from −3V to 3V. The threshold voltage line has a slope of 80 mV/V.

Figure 2:
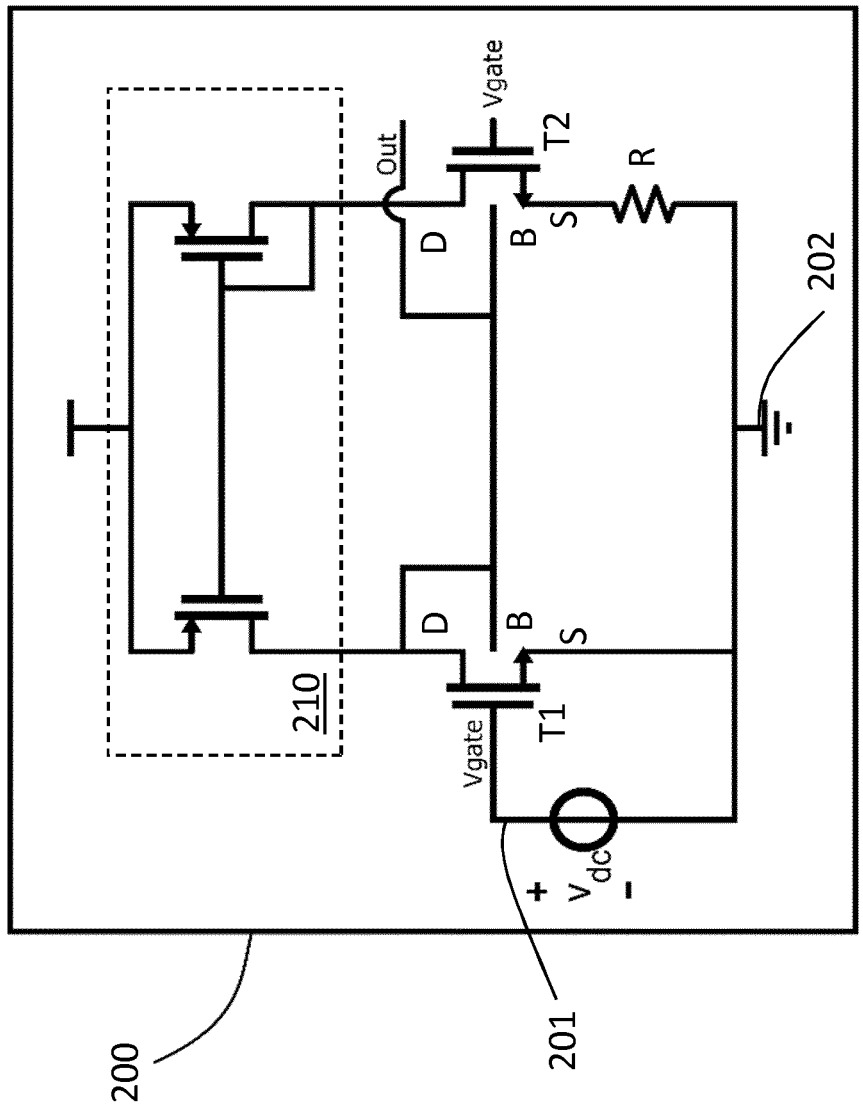
FIG. 2 is a schematic view of a constant transconductance bias circuit operating on the back gate according to embodiments herein.

Knowing this threshold voltage characteristic, a temperature compensating bias circuit 200 according to embodiments herein is shown in FIG. 2. This resembles a classical constant gm circuit but with a twist where the gates and back gates have been reversed with respect to connections.

The constant transconductance circuit 200 comprises a current mirror 210, a first transistor T1 and a second transistor T2, wherein each transistor has a first gate, a back gate, a drain and a source. The first gates Vgate of the first and second transistors T1/T2 are connected to a first terminal 201 having a first voltage, e.g. a supply voltage $V_{dc}$. The source S of the first transistor T1 is connected to a second terminal 202, e.g. a signal ground.

The source S of the second transistor T2 is connected to the second terminal 202 via a resistive circuit element, e.g. a resistor R. According to some embodiments herein, the resistive circuit element may comprise switches to make it reconfigurable.

The drains D of the first and second transistors T1/T2 are coupled to the current mirror 210 such that the current drawn from the current mirror 210 by the second transistor T2 is mirrored and output to the first transistor T1.

The back gate B of the first transistor T1 is connected to its drain D and further connected to the back gate of the second transistor T2. The temperature compensation signal Out is provided from the back gates B of the first and second transistors T1/T2.

With this configuration, the bias circuit 200 will provide a constant gm for a PA referred to the back gate instead of the gate. Now, the target is actually to provide a constant gm referred to the gate of the PA as this is where the RF signal is input, but as will be shown in simulations, this indirect way of controlling the gate-referred gm provides the desired behavior, implying a good tracking between gate-referred and back gate-referred gm.

Figure 3:
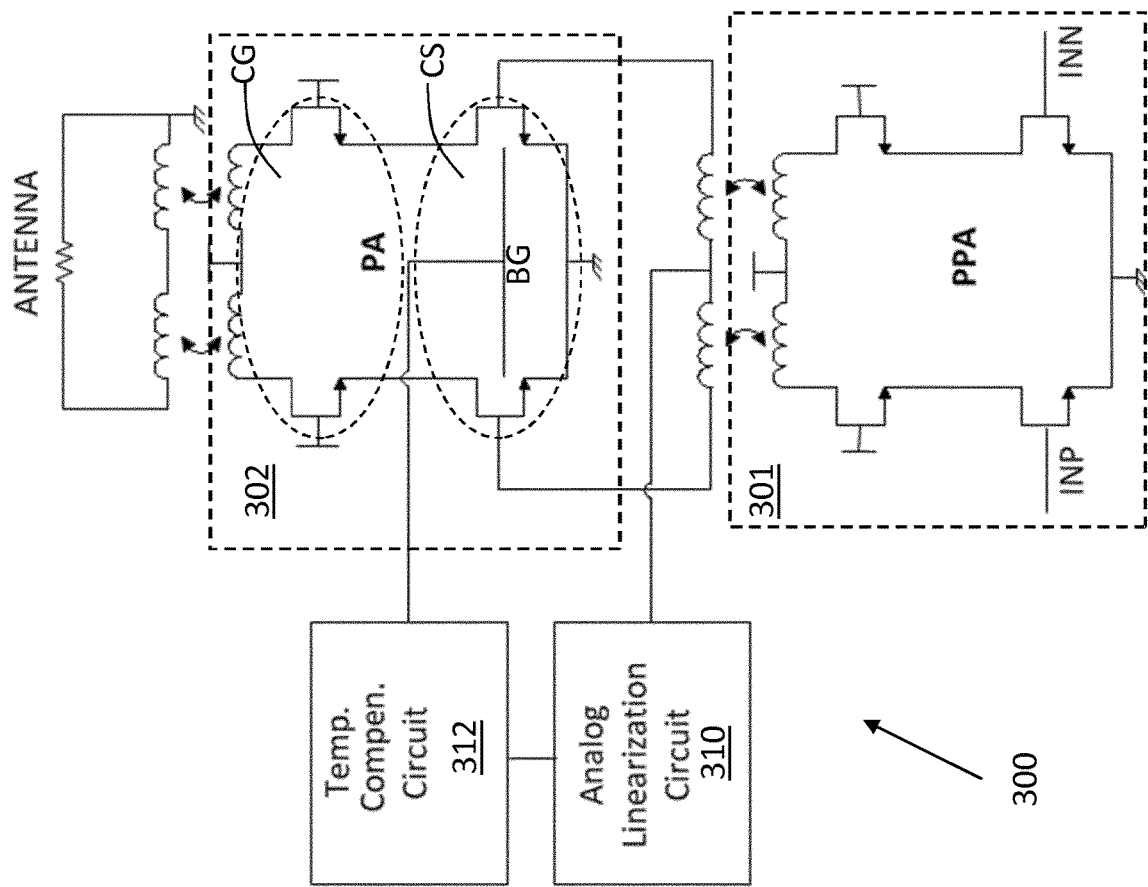
FIG. 3 is a schematic view illustrating a power amplifier arrangement according to embodiments herein.

FIG. 3 shows an amplifier arrangement 300 comprises a pre power amplifier PPA 301 driving a power amplifier PA 302 that uses a prior art analog linearization circuit 310 in combination with a novel temperature or process compensation circuit 312 operating on the back gate of the PA 302 input transistors.

The power amplifier gain drops when input power increases since it approaches its saturation region. The gain drop may be mitigated by gradually changing bias point of the PA transistor. In this way, it is possible to achieve a more linear output than if the bias point was constant. In other words, the saturation region may be improved or "sharpened" from a gradual gain reduction with increasing input signal level towards a characteristic ultimately resembling a clipping behavior. This is the purpose of having a circuit that creates an analog linearization by increasing the bias voltage for increasing input signal level. Another, just as important, reason for increasing the bias point at high input signal levels or swings, is to reduce peak drain to gate voltage (Vdg) for the input stage. At high input signal swing, the drain of the input stage device will be roughly half of the output voltage Vout/2, since the signal swing is distributed over the input common source CS stage and the cascaded common gate CG stage, see FIG. 3. At the same time the gates of the input stage is typically swung below ground if a typical class AB/C bias is selected. Therefore, increasing the bias voltage at the gates of the input stage will expand the possible input signal swing range for which the PA 302 does not break. This is realized by increasing the supply DC voltage to the gates of the input stage provided from the analog linearization circuit 310.

The straightforward way to apply a temperature compensating bias voltage may be to modify the bias voltage at the gates of the input transistors of the PA 302. However, as the gates of the input stage, from a dc perspective, are controlled by the output of the analog linearization circuit 310, the two outputs may have to be added. As mentioned earlier, adding signals in voltage domain is challenging without compromising either one of the desired control functions, i.e. the temperature compensation and the linearization.

According to embodiments herein, a solution to this problem is presented in FIG. 3, by using the back-gates of the input transistors to perform thermal and process compensation while the gates are used to apply the faster changing analog linearization signal. That is the output signal from the temperature or process compensation circuit 312 is applied on the back-gates BG of the input CS stage transistors.

According to some embodiments herein, the output signal from the temperature or process compensation circuit 312 may be applied on the gates of the input CS stage transistors, while the output signal from the analog linearization circuit 310 may be applied on the back-gates BG of the input CS stage transistors.

Therefore, the embodiments herein provide a power amplifier arrangement 300. The power amplifier arrangement 300 comprises a power amplifier comprising at least one transistor having a first gate and a second gate, i.e. back gate. The first gate is configured to receive a radio frequency input signal superimposed with a first control signal, and the second gate is configured to receive a second control signal. The first control signal is a linearization signal varying in relation to an envelope of the input signal and the second control signal is a temperature compensation signal varying in relation to a temperature of the power amplifier, or vice versa.

The temperature of the power amplifier may be any one of a temperature of a substrate, a temperature of a package, a temperature of ambient where the power amplifier is implemented.

The power amplifier arrangement 300 may further comprise a bias circuit 312 configured to provide the temperature compensation signal to the first or second gate.

According to some embodiments herein, the bias circuit 312 may be the constant transconductance circuit 200 operating on the back/second gate of the at least one transistor in the power amplifier arrangement 300.

According to some embodiments herein, the DC supply voltage, i.e. the first control signal provided by the analog linearization circuit 310, on the gates of input CS stage transistors of the PA 302, may be the supply voltage, i.e. the first voltage, applied to the gates of the first and second transistors in the constant transconductance circuit 200. Therefore, in the constant transconductance circuit 200, the first voltage may have a relation with the first control signal, and the second terminal may be a signal ground.

According to some embodiments herein, in the constant transconductance circuit 200, the first voltage may be related to the time average of the first control signal. This implies that the time varying first control signal is averaged, or rather filtered with a low pass filter such that the varying part of the envelope of the first control signal is essentially removed, and then applied to the constant transconductance circuit 200. This solution is simple, just a basic passive low pass filter is required. However, the average of the envelope may be non-zero, thus an offset may be introduced to the first voltage that will vary with the properties of the RF input signal.

According to some embodiments herein, in the constant transconductance circuit 200, the first voltage may be related to the constant part of the first control signal, i.e. not dependent on the envelope of the input RF signal. Thus, there is no uncertainty introduced in this regard for the constant transconductance circuit 200. However, the constant part of the first control signal must be available, separated from the envelope part and this may restrict the number of available circuit solutions for generating the first control signal.

Figure 4:
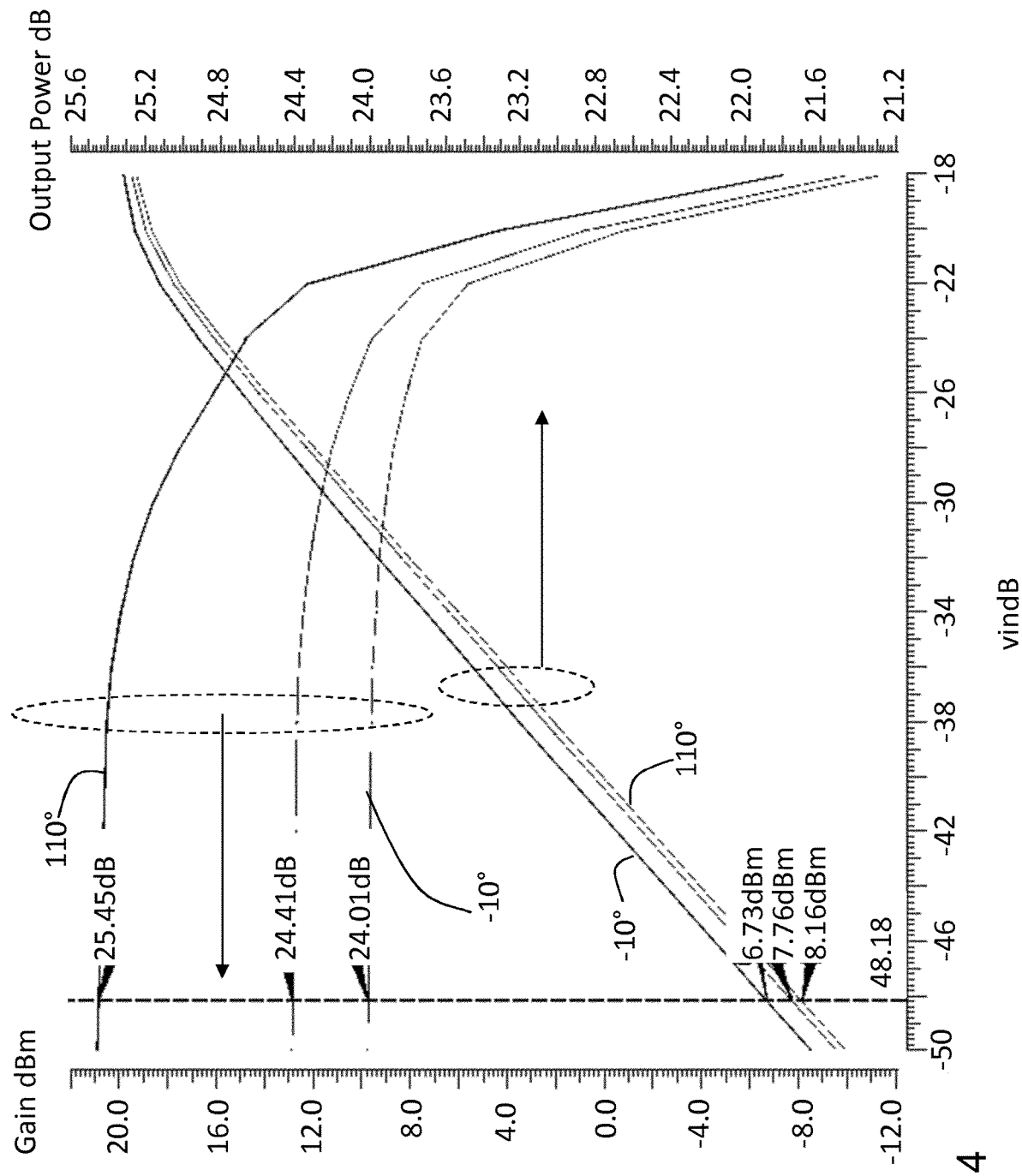
FIG. 4 is a diagram illustrating simulation results for gain and output power without temperature compensation.

FIG. 4 shows output power and gain for the amplifier arrangement 300 with analog pre-distortion applied at gates and constant voltage at the back gates, i.e. no temperature compensation. As seen from the notations in FIG. 4, at input power vindB=−48.18 dB, the small signal gain varies from 24.01 dB to 25.45 dB, a variation of about 1.5 dB, and the output power varies from −6.73 dBm to −8.16 dBm, a variation of about 1.4 dBm, when temperature goes from −10 to 110 degrees Celsius.

Figure 5:
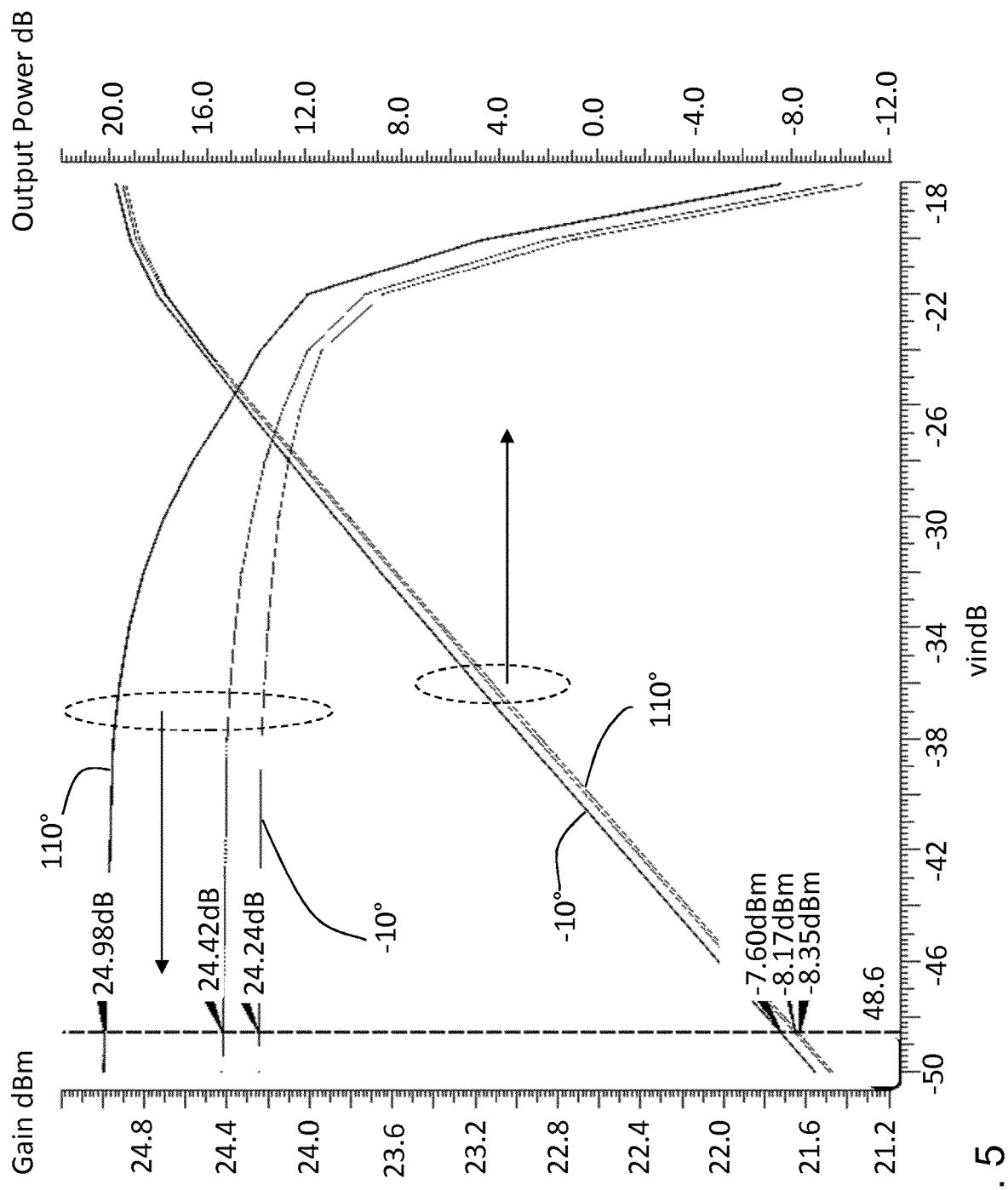
FIG. 5 is a diagram illustrating simulation results for gain and output power with temperature compensation.

FIG. 5 shows output power and gain for the amplifier arrangement 300 with analog pre-distortion applied at gates and temperature compensated voltage at the back gates. As seen from the notations in FIG. 5, at input power vindB=−48.6 dB, the small signal gain varies from 24.24 dB to 24.99 dB, a variation of about 0.75 dB, and the output power varies from −7.6 dBm to −8.35 dBm, a variation of 0.75 dBm, over temperature ranging from −10 to 110 degrees Celsius. The gain and output power variations are reduced compared to the one without temperature compensation. This reduction may further be improved if the constant gm circuit 200 operation on the back gates is optimized.

As one may see from the simulation results, the bias circuit 200 provides a constant gm for a PA referred to the back gate instead of the gate. This indirect way of controlling the gate-referred gm provides the desired behavior, implying a good tracking between gate-referred and back gate-referred gm.

If the back gate temperature compensation signal is generated from a prior art gate operated constant gm circuit, i.e. the gate-referred circuit, it will need to be amplified since the transistors are less sensitive on the back gate than on the gate. However more importantly the output signal from a prior art gate operated constant gm circuit will not track the same fundamental process variations as the back gate controlled transconductance circuit 200 will. Thus the transistors being controlled on the back gate in the PA 302 by a prior art gate operated constant gm circuit may require compensation that follows the process variation of the back gate. That means the amplified signal generated from the prior art gate operated transconductance circuit may need calibration to compensate for process variations.

To summarize, according to embodiments herein, a first control signal, e.g. a faster changing analog linearization signal, in addition to the fundamental frequency input signal, may be connected to the first gate of a PA transistor and a second control signal, e.g. a slower changing temperature compensation signal may be connected to the back gate of the PA transistor. In this way, the PA will benefit both from the analog linearization changing bias and the temperature compensation bias at the same time.

The embodiments herein enable an effective method of both applying analog pre-distortion and temperature compensation bias at the same time for a power amplifier without compromising respective function. To guarantee that the temperature dependence of the back gate bias signal tracks the inherently same process variation as the process variation of the target transistors inside the PA, the constant transconductance bias circuit 200 may generate the bias signal operating on the back gate of a transistor.

Figure 6:
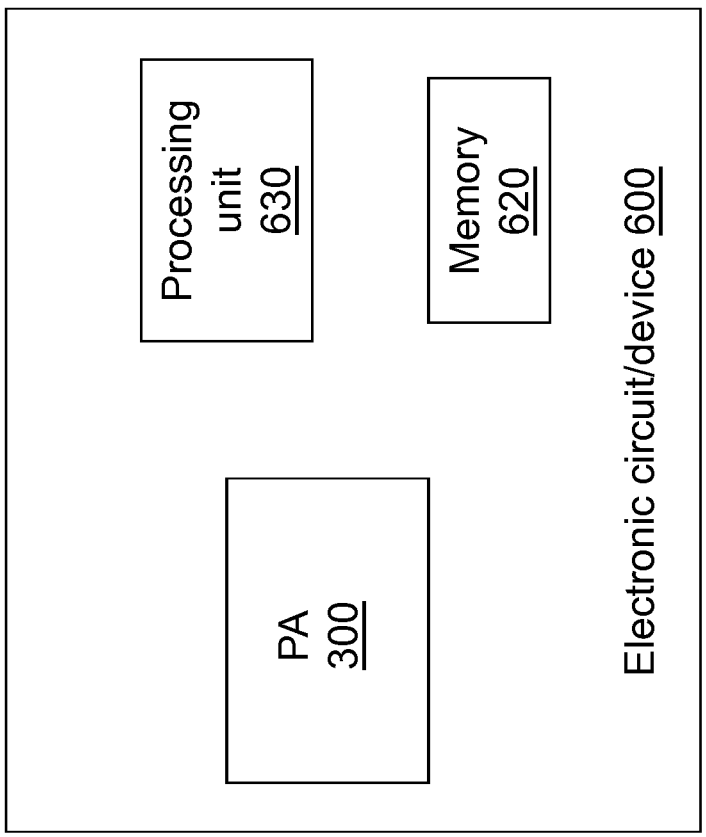
FIG. 6 is a block diagram illustrating an electronic circuit or apparatus in which embodiments herein may be implemented.

The power amplifier arrangement 300 according to the embodiments herein may be employed in various electronic circuits or apparatus. FIG. 6 shows a block diagram for an electronic circuit or apparatus 600. The electronic circuit or apparatus 600 comprises a power amplifier arrangement 300. The electronic circuit or apparatus 600 may be a transmitter or a transceiver in a cellular communications system/network. The electronic apparatus 600 may comprise other units, where a memory 620, a processing unit 630 are shown. The electronic apparatus 600 may be a user equipment or a mobile device, a wireless communication device, a radio base station for a cellular communication system.

Those skilled in the art will understand that the power amplifier arrangement 300 according to embodiments herein may be implemented by any semiconductor technology, where a bulk or a back gate of a transistor device is a fourth accessible terminal.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A power amplifier arrangement, comprising:
    a power amplifier; the power amplifier comprising at least one transistor having a first gate and a back gate; wherein the first gate is configured to receive a radio frequency input signal superimposed with a first control signal; wherein the back gate is configured to receive a second control signal;
    wherein the first control signal is a linearization signal varying in relation to an envelope of the input signal, and the second control signal is a temperature compensation signal varying in relation to a temperature of the power amplifier, or vice versa.

2. The power amplifier arrangement of claim 1, wherein the temperature of the power amplifier is a temperature of a substrate, a temperature of a package, or a temperature of ambient where the power amplifier is implemented.

3. The power amplifier arrangement of claim 1, further comprising a bias circuit configured to provide the temperature compensation signal to the first or back gate.

4. The power amplifier arrangement of claim 3:
wherein the bias circuit comprises a constant transconductance circuit operating on a back gate;
wherein the constant transconductance circuit comprises:
- a current mirror;
- a first transistor having a first gate, a back gate, a drain, and a source;
- a second transistor having a first gate, a back gate, a drain, and a source;

wherein:
- the first gates of the first and second transistors are connected to a first terminal having a first voltage;
- the source of the first transistor is connected to a second terminal;
- the source of the second transistor is connected to the second terminal via a resistive circuit element;
- the drains of the first and second transistors are coupled to the current mirror such that the current drawn from the current mirror by the second transistor is mirrored and output to the first transistor;
- the back gate of the first transistor is connected to the first transistor's drain and further connected to the back gate of the second transistor; and
- the temperature compensation signal is provided from the back gates of the first and second transistors.

5. The power amplifier arrangement of claim 4:
wherein the first voltage has a relation with the first control signal; and
wherein the second terminal is a signal ground.

6. The power amplifier arrangement of claim 5, wherein the first voltage is related to a time average of the first control signal.

7. The power amplifier arrangement of claim 5, wherein the first voltage is related to a constant part of the first control signal.

8. The power amplifier arrangement of claim 4, wherein the resistive circuit element comprises switches.

9. An electronic circuit, comprising:
a power amplifier arrangement, the power amplifier arrangement comprising:
a power amplifier; the power amplifier comprising at least one transistor having a first gate and a back gate; wherein the first gate is configured to receive a radio frequency input signal superimposed with a first control signal; wherein the back gate is configured to receive a second control signal;
wherein the first control signal is a linearization signal varying in relation to an envelope of the input signal, and the second control signal is a temperature compensation signal varying in relation to a temperature of the power amplifier, or vice versa.

10. An electronic apparatus, comprising:
a power amplifier arrangement, the power amplifier arrangement comprising:
a power amplifier; the power amplifier comprising at least one transistor having a first gate and a back gate; wherein the first gate is configured to receive a radio frequency input signal superimposed with a first control signal; wherein the back gate is configured to receive a second control signal;
wherein the first control signal is a linearization signal varying in relation to an envelope of the input signal, and the second control signal is a temperature compensation signal varying in relation to a temperature of the power amplifier, or vice versa.

11. The electronic apparatus of claim 10, wherein the electronic apparatus is a wireless communication device for a cellular communication system.

12. The electronic apparatus of claim 10, wherein the electronic apparatus is a radio base station for a cellular communication system.

* * * * *